United States Patent
Carlesi et al.

(10) Patent No.: US 6,618,425 B1
(45) Date of Patent: Sep. 9, 2003

(54) VIRTUAL LASER OPERATOR

(75) Inventors: Jason R. Carlesi, San Diego, CA (US);
David J. Dunlap, San Diego, CA (US);
Igor V. Fomenkov, San Diego, CA (US)

(73) Assignee: Cymer, Inc., San Diego, CA (US)

( * ) Notice: Subject to any disclaimer, the term of this patent is extended or adjusted under 35 U.S.C. 154(b) by 0 days.

(21) Appl. No.: 09/442,140

(22) Filed: Nov. 17, 1999

(51) Int. Cl.⁷ .............................. H01S 3/00; G06F 19/00
(52) U.S. Cl. ...................... 372/109; 700/166; 700/168; 700/180
(58) Field of Search ................................ 700/166, 168, 700/181, 180, 84, 86; 703/13; 606/5–11; 713/1

(56) References Cited

U.S. PATENT DOCUMENTS

| | | | | |
|---|---|---|---|---|
| 3,634,662 A | * | 1/1972 | Slawson | 235/151.11 |
| 4,849,249 A | * | 7/1989 | Ishihara | 427/554 |
| 5,047,700 A | * | 9/1991 | Szakaly | 318/568.1 |
| 5,311,032 A | * | 5/1994 | Montoro | 250/584 |
| 5,600,121 A | * | 2/1997 | Kahn | 235/472 |
| 5,744,791 A | * | 4/1998 | Isaac | 235/472 |
| 5,771,114 A | * | 6/1998 | Anderson | 359/171 |
| 5,856,991 A | * | 1/1999 | Ershov | 372/57 |
| 6,067,306 A | * | 5/2000 | Sandstrom | 372/38 |
| 6,236,509 B1 | * | 5/2001 | Grandjean | 359/566 |

* cited by examiner

Primary Examiner—Quyen Leung
Assistant Examiner—Davienne Monbleau
(74) Attorney, Agent, or Firm—William Cray

(57) ABSTRACT

A laser controller interconnected with an electric discharge laser communicates with a remote computer incorporating a display screen programmably emulating a conventional keyboard. The display screen has a plurality of imaged virtual keys each programmably emulating a physical key of a conventional keyboard. Some virtual keys programmably emulate a prescribed sequence of keystrokes, which control, monitor, and record the laser operation. A prescribed sequence can optionally be automated, conditional, or interrupted by operator prompts. The remote computer communicates serially with the laser controller through an electrically conductive cable, a fiberoptic link, or a wireless channel. A keystroke is typically applied by manually pressing the position of a corresponding virtual key on a touch sensitive screen, or alternatively by actuating a conventional pointing device. The electric discharge laser can be a KrF or ArF excimer laser, or a $F_2$ molecular laser, which can be applied as a radiation exposure source for microlithography.

20 Claims, 13 Drawing Sheets

FIG. 7F array to spreadsheet-gui.vi

File  Edit  Operate  Windows  Help

C:\Applied Technology\APP TECH Transfer\Virtual Paddle\ver1\Data Folder\matt.txt

| AVERAGE PULSE ENERGY OUTPUT AT INTERNAL HV MODE | | | | | HIGH VOLTAGE & BANDWIDTH AT INTERNAL ENERGY MODE | | | | Filter Current | Total Number of Shots |
|---|---|---|---|---|---|---|---|---|---|---|
| HV(VOLT) | 800 | 700 | 600 | | ENERGY=10mJ REP RATE=1000HZ | | | | | |
| REP RATE | 1000 | 1000 | 100 | 500 | | | | | | |
| DATE | D1 | PULSE ENERGY(µJ) | | | HV | D108 | D79 | D83 | D25 | D151 |
| | | | | | | | | D40 | (µA) | (Million) |
| 9/10/98 | 1.00 | 11.316 60 | 9490.25 | 5066.31 | 4829.65 | 4700.25 | 714.00 | 108.00 | 79.00 | 83.00 | 40.00 | 25.00 | 151.00 |

READ FILE     EXIT

US 6,618,425 B1

VIRTUAL LASER OPERATOR

FIELD OF THE INVENTION

This invention relates to a control system and operator interface for a laser, and particularly for an electric discharge laser used in an industrial application.

BACKGROUND

Lasers for industrial applications, such as KrF or ArF electric discharge lasers for microlithography (see U.S. Pat. No. 4,959,840, issued Sep. 25, 1990 to Akins, et al.), typically incorporate a laser controller, resident at the laser. Input and output interfaces to the laser controller are typically provided in two ways: (i) through an operator actuated hand held terminal, and/or (ii) through a workstation controller that acts as a master controller, with the resident laser controller acting as its slave. The workstation controller primarily controls and synchronizes workstation subsystems, such as workpiece positioning and orientation and other process functions relating to the specific industrial application. The interface specifications between the laser controller and the workstation controller may vary greatly, depending on the application. For example in microlithography, subsystems include the laser, illumination system, projection system, and scanner.

A primary function of the hand held terminal is to operate the laser independently of the workstation and application. The hand held terminal typically permits complete operation of the laser by a human operator and acts as a primary means of communication between the laser and the operator. For example, all laser status conditions (e.g., operational state, operational errors, etc.) are communicated from the resident laser controller to the operator, usually by visual display, through the hand held terminal. Likewise, the operator can control various functions of the laser, e.g., changing the operating state, by depressing a prescribed key in the hand held terminal. The keystroke is interpreted by the hand held terminal, translated to an appropriate electrical command, and serially communicated to the resident laser controller.

Control of the laser by the operator is greatly enhanced by the ability to sequence various keystrokes. For example, the operator can sequentially change the operating state of the laser, perform a gas refill, again change the operating state of the laser, and run the laser by a prescribed sequence of keystrokes. Conversely, the laser controller keeps the operator informed of the status of the laser by displaying relevant information at the hand held terminal.

Frequently, a laser operator is required to perform repetitive operations with a laser. For example, when a new laser chamber is installed, the operator performs a sequence of gas refills, each followed by operation of the laser under different prescribed conditions. The operator typically repeats these operations until the laser meets certain performance criteria. Similarly, an operator typically performs a weekly diagnostic check, filling the laser with a prescribed gas composition, operating the laser under different prescribed conditions, and check the magnitudes of prescribed laser operating parameters. Typically these magnitudes are then manually recorded by the operator in a log sheet. In some cases, when a number of operations are sequenced, an operator may omit an operation or perform an operation out of sequence, thereby obtaining erroneous results. Similarly, an operator may inadvertently record data erroneously in a manual log sheet. In either case, the consistency and accuracy of data is suspect, and the results can have adverse consequences for the performance of the laser and/or of the application.

It is therefore desirable in the art to provide a method and apparatus that minimize an operator's repetitious tasks, reduces the probability of operator error, and enhances the reliability of recording laser operating status data.

SUMMARY OF THE INVENTION

A laser controller interconnected with an electric discharge laser communicates with a remote computer incorporating a display screen programmably emulating a conventional input device (e.g., standard computer keyboard, keypad, touchpad). The display screen has a plurality of imaged virtual keys each programmably emulating a physical key of the conventional input device, and at least one of the virtual keys is programmably configured to emulate a predefined sequence of keystrokes. The remote computer is interconnected to the laser controller with an electrically conductive cable, or alternatively through a fiberoptic link or over a wireless communication channel. The virtual keys can include a function key and/or a "LASER OFF" key.

A keystroke is applied by manually pressing the position of a corresponding virtual key on a touch sensitive screen, or alternatively by actuating a pointing device. In some embodiments of the present invention a prescribed sequence is automated, whereas in some embodiments a sequence is conditioned on a measured value or on operator response to a prompt. In a preferred embodiment, a keystroke is applied at a remote computer, serially communicating signals in response to the keystroke, to effect an action at an electric discharge laser. Actions can include measuring, recording, and/or changing values of laser parameters, or sequences including any or all of these functions. A prescribed sequence is typically defined according to a programmably created script that links a desired sequence of operations to a preselected keystroke.

The electric discharge laser can be a KrF or ArF excimer laser, or a $F_2$ molecular laser, which can provide a radiation exposure source for microlithography.

The present invention is better understood upon consideration of the detailed description below, in conjunction with the accompanying drawings.

BRIEF DESCRIPTION OF THE DRAWINGS

The present invention may be better understood, and its numerous objects, features, and advantages made apparent to those skilled in the art by referencing the accompanying drawings. For simplicity and ease of understanding, the use of similar reference symbols in different drawings indicates similar or identical items.

FIGS. 7A–7G are pictorial examples of display screen segments associated with function keys.

DETAILED DESCRIPTION OF THE EMBODIMENTS

The following is a detailed description of illustrative embodiments of the present invention. As these embodiments of the present invention are described with reference to the aforementioned drawings, various modifications or adaptations of the methods and or specific structures described may become apparent. These descriptions and drawings are not to be considered in a limiting sense as it is understood that the present invention is in no way limited to the embodiments illustrated.

This invention relates to a control system and operator interface for a laser, and particularly for an electric discharge laser used in an industrial application. Embodiments of the invention can be used with, e.g., ArF and KrF excimer lasers and $F_2$ molecular lasers for microlithography. The present invention provides a method and apparatus that minimize a laser operator's repetitious tasks. Many sequential tasks can be combined automatically into a single task activated by a single keystroke. New automated single keystroke tasks can be defined by building from a sequence of predefined subtasks, each previously requiring individual keystrokes. Data acquisition is automated. Relevant data is automatically logged electronically during the execution of selected tasks. Electronic data logging can be automatically triggered, when the laser status reaches a predefined condition. For example, if the laser controller detects an error, data logging can automatically record the magnitudes of selected laser parameters at the moment the error is detected. These aspects of the invention improve the consistency of data and reduce human error. Other aspects of the invention provide expanded graphic display capability for convenient presentation of laser condition monitoring data. Additionally, electronic storage of data facilitates future analysis.

In some embodiments of the invention, the traditional input device, e.g., a conventional hand held terminal, is upgraded to provide the full functionality typical of a compact laptop computer, familiar in the art. A subsection of a display of a laptop or similar computer remote from the laser controller can emulate the conventional hand held terminal. Additionally, this emulation can switch seamlessly to provide a functionally expanded software program resident in the remote laptop or similar computer, that provides automated multitask management of multiple sequenced tasks previously requiring multiple individual keystrokes using a conventional hand held terminal. As permitted by computer technology and economics, custom configured computers and/or computers having greater functionality and/or compactness can be substituted for the remote laptop computer.

Figure 1:
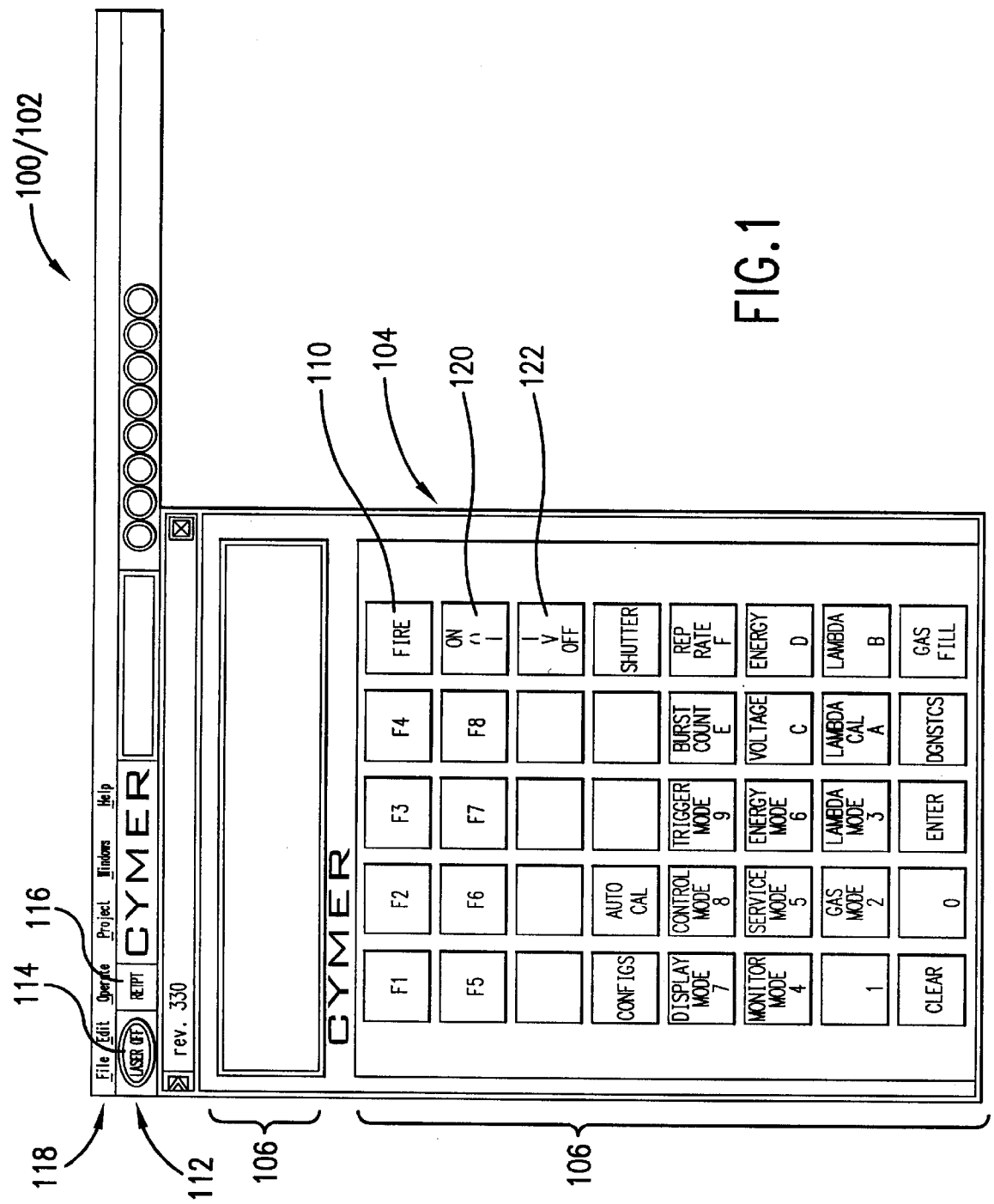
FIG. 1 is a pictorial representation of a subsection of a display screen of a fully functional remote computer that replicates a keypad portion and a display portion of a conventional hand held terminal.

FIG. 1 is a pictorial representation of a subsection 104 of a display screen 102 of a fully functional remote computer 100, for example a laptop computer, that replicates a keypad portion 106 and a display portion 108 of a conventional hand held terminal (not shown). In the embodiment of FIG. 1, virtual keys 110 displayed as images on display screen 102 communicate exactly the same commands to a laser (not shown) as do corresponding physical keys on a conventional hand held terminal. A specific virtual key 110 can be actuated by selection with a traditional computer pointing device, e.g., a mouse, track ball, or graphics tablet and pen (not shown). Alternatively, a virtual key 110 can be actuated by manually pressing its position on a touch sensitive display screen, familiar in the art. A virtual key 110, when actuated, serially communicates the function of the key to a laser controller adjacent to the laser. Conversely, operating status data, e.g., error messages, are communicated serially from the laser controller to remote computer 100, where they are decoded and displayed on display portion 108 of remote computer 100.

The replicated display subsection 104 is implemented by a graphic user interface (gui) of a computer software program, written for example in conventional LabVIEW and/or Visual C++ programming languages, that can either stand alone or be incorporated as a subprogram into a larger software program. A larger program can, for example, sequence several keystrokes, wait for a response from the laser controller for each keystroke, and/or store the responses received at each sequential keystroke. The larger software program replicating and expanding the functions of the conventional hand held terminal is referred to herein as a "Virtual Laser Operator." The replicated keypad portion 106 of display screen 102 is denoted herein as a "Virtual Paddle," containing virtual keys 110.

Figure 2:
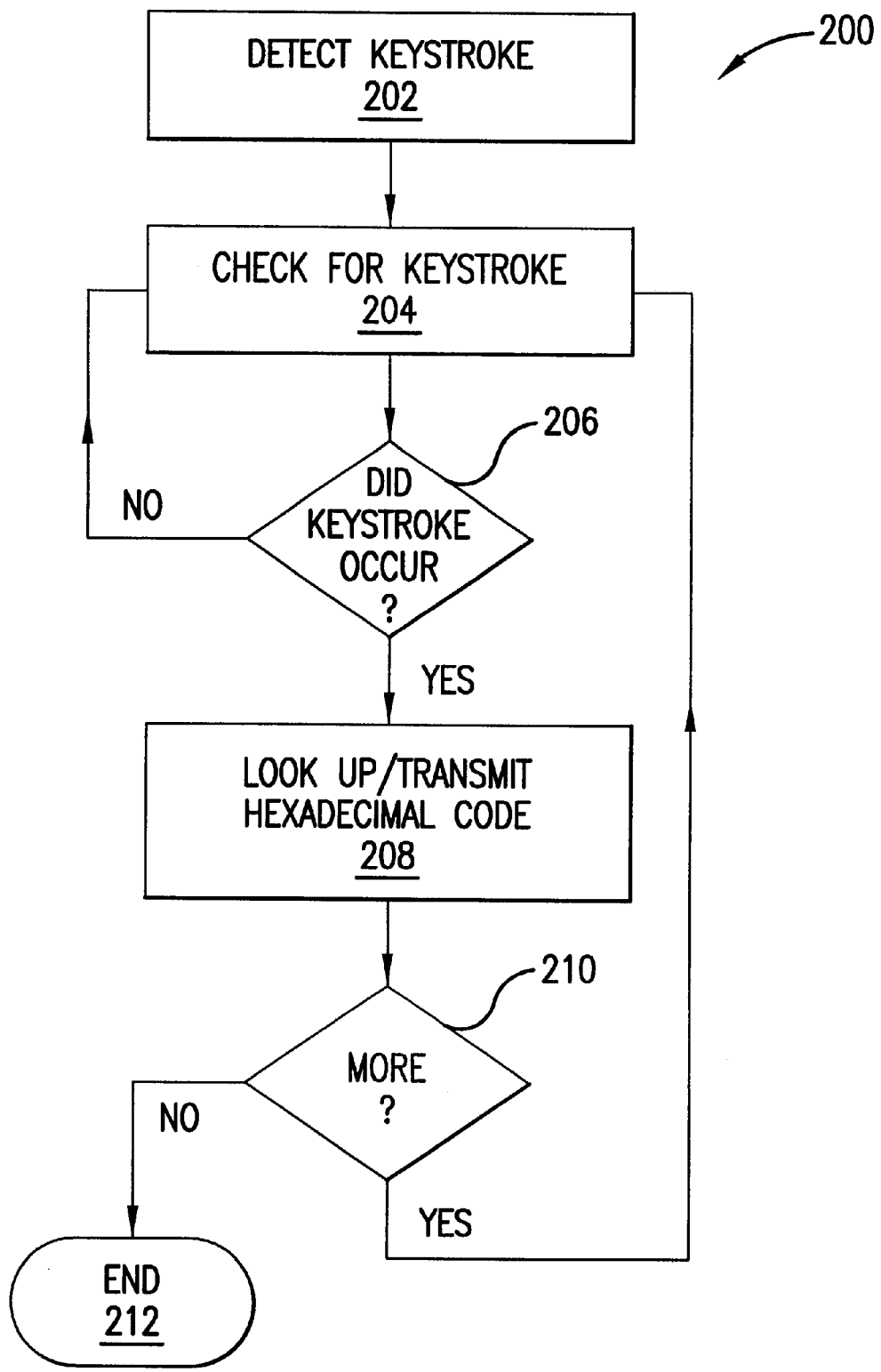
FIG. 2 is a flow diagram illustrating an example of serial communication protocol between a remote computer and a laser controller.

FIG. 2 is a flow diagram illustrating an example of serial communication protocol 200 between remote computer 100 and the laser controller. In FIG. 2, a keystroke is detected at Module 202. Module 204 checks for the keystroke, causing module 206 to issue a false logic level if there is no keystroke, whereupon logic control returns to module 204 to check again for a keystroke. If a keystroke is present, then block 206 issues a true logic level, and transfers logic control to module 208, which looks up the hexadecimal code for the keystroke and communicates it to the laser controller. Logic control is then switched to module 210, which checks to see if additional keystrokes have been detected. If so, logic control is returned to block 204; if not, logic flow is terminated by END module 212. The interface between the laser controller and the computer is universal in that the communication protocol therebetween is independent of the protocol between the laser controller and the applications dependent workstation controller.

Figure 3:
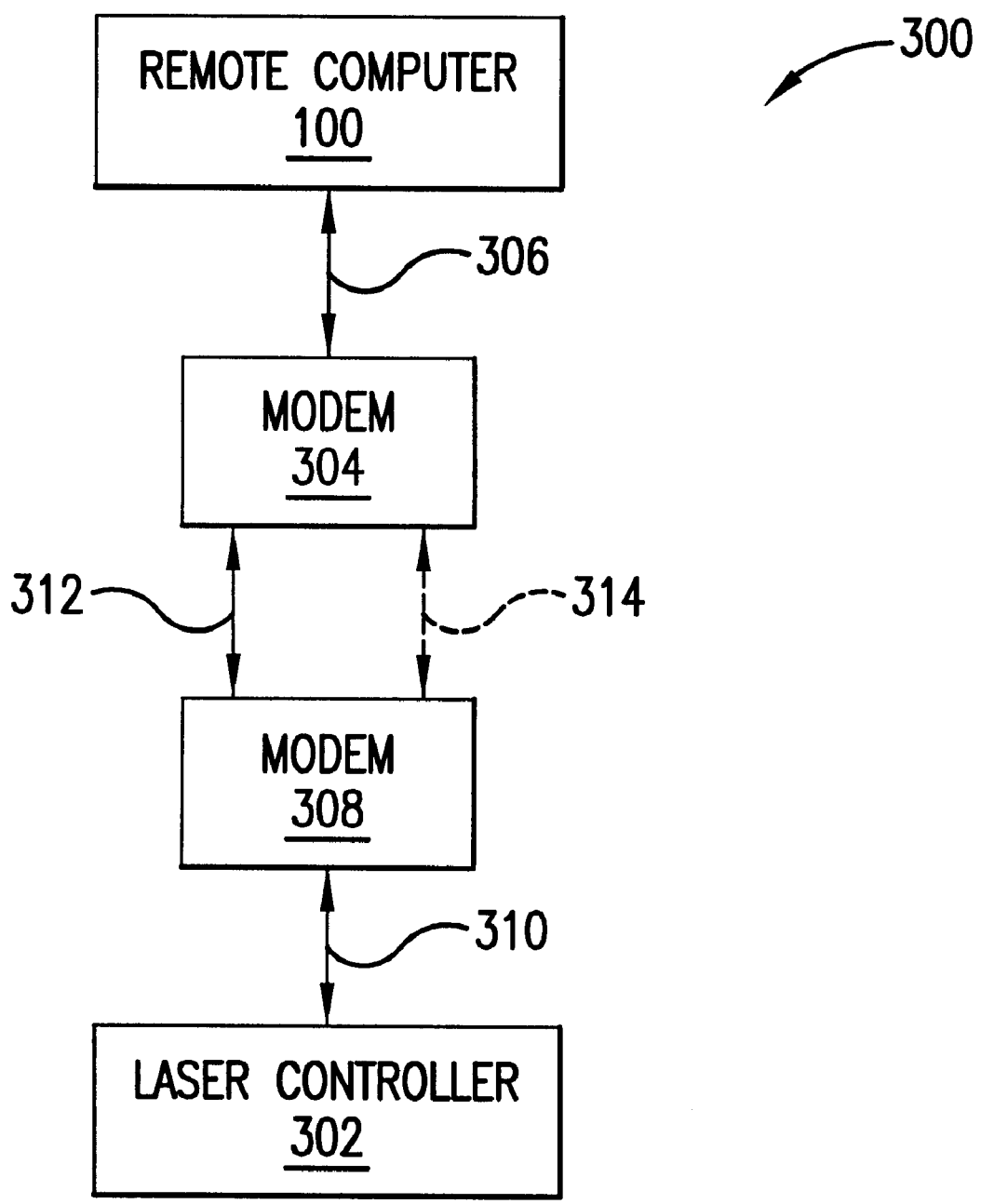
FIG. 3 is a block diagram illustrating an example of a serial communication link between a remote computer and a laser controller.

Typically, communication between the laser controller and remote computer 100 utilizes an electrically conductive cable, although suitably high-bandwidth fiber optic data links or wireless channels can alternatively be used. FIG. 3 is a block diagram illustrating an example of a serial communication link 300 between remote computer 100 and a laser controller 302. Remote computer 100 is interconnected with an electronic modulator/demodulator (modem) 304 using an electrically conductive or fiber optic cable 306. Laser controller 302 is similarly interconnected with a similar modem 308 using an electrically conductive or fiber optic cable 310. Modems 304 and 308 are connected together with an electrically conductive or fiber optic serial cable 312. Alternatively, modems 304 and 308 communicate through wireless transmission media 314 (represented by a dashed line in FIG. 3), employing, for example, rf, microwave, or optical transmission. Modems 304, 308 and cable 312 or wireless transmission media allow two-way communication between remote computer 200 and laser controller 302.

Figure 4:
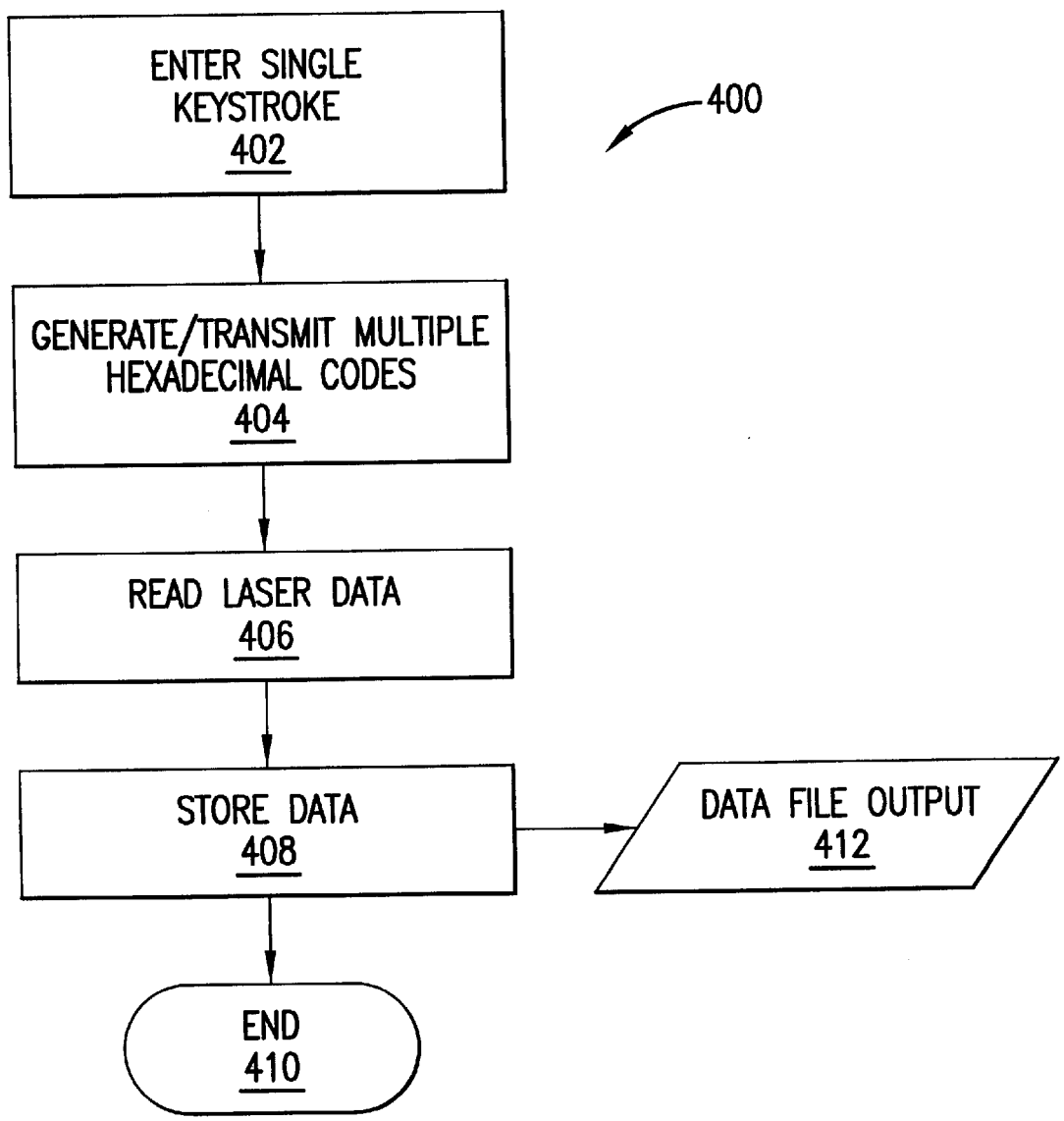
FIG. 4 is a logic flow diagram illustrating the use of a single keystroke to read and record data from a laser controller.

Illustratively, a laser operator desires to record and store the magnitudes of the laser's gas temperature and pressure as a function of time over a particular interval. Using a conventional hand held controller, an operator is required to manually read the magnitudes of these parameters from the hand held terminal display and then record the magnitudes manually, e.g., with ink on paper. Using a computer based Virtual Laser Operator in accordance with the present invention, the larger software program causes a single keystroke to emulate the multiple keystrokes required to read the magnitudes of the desired two parameters and to record them, e.g., in a spreadsheet format, for readout and/or further processing. FIG. 4 is a logic flow diagram 400 illustrating the use of a single keystroke to read and record data from a laser controller. A single keystroke is entered at block 402, generating at block 404 the hexadecimal codes of the multiple keys according to a predefined script to retrieve the laser data. Data is read at block 406, and is transferred to block 408, where it is stored, for example in a spreadsheet format. Following this operation, logic control is transferred to END block 410, which terminates the reading and logging of data. A data file 412 created at block 408 is optionally outputted on, e.g., a printer or display screen.

Figure 5:
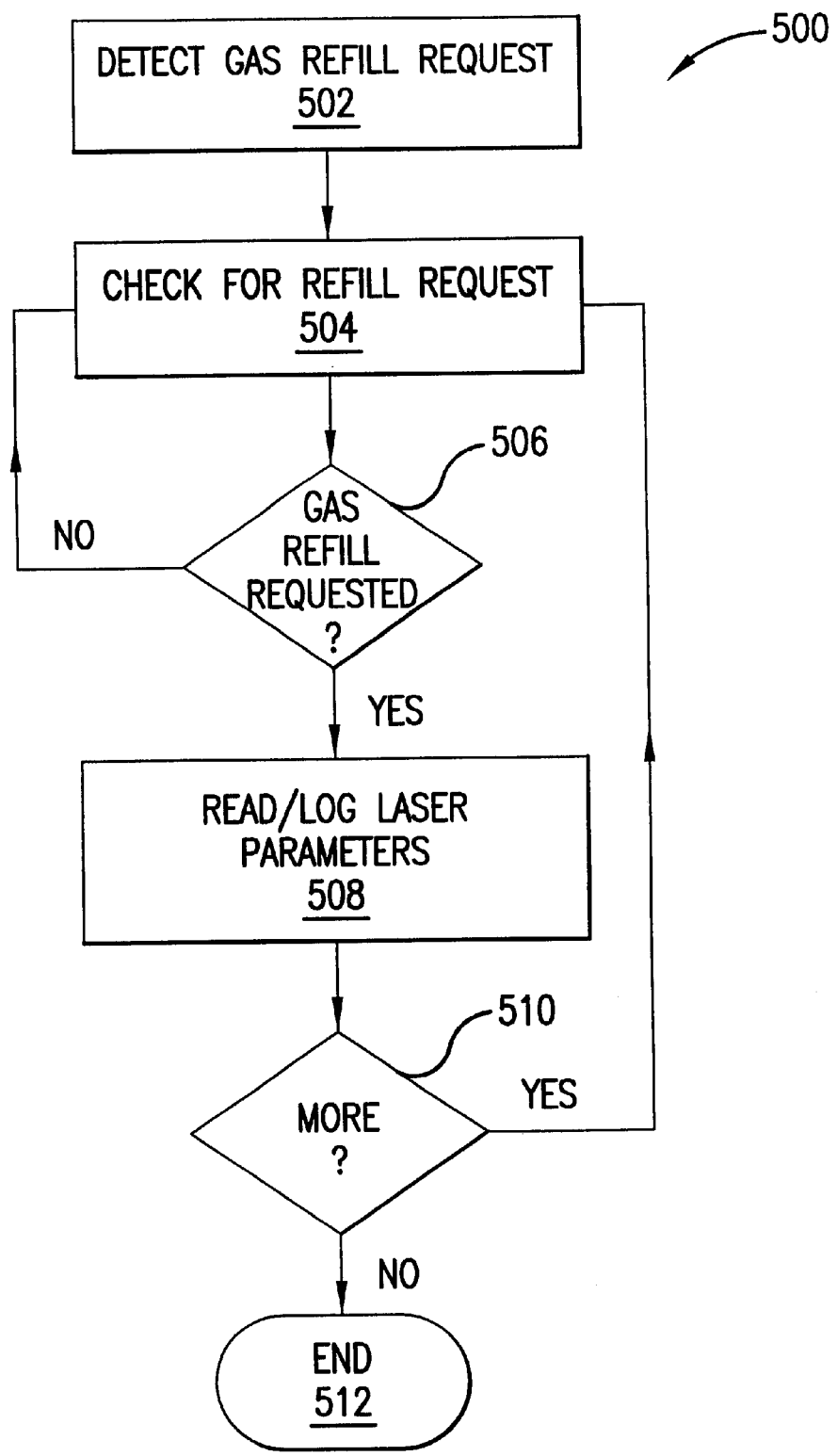
FIG. 5 is a logic flow diagram illustrating how a data acquisition procedure is triggered by a prescribed event.

FIG. 5 is a logic flow diagram illustrating how a data acquisition procedure 500 is triggered by a prescribed event. For example, laser gas temperature can be recorded when the laser requires a gas refill, which is detected in block 502. In this event, the software program checks for the refill request at block 504. If no refill request is detected, then block 506 returns logic control to block 504 to check again for a refill request at 502; if a refill request is detected, then logic control is transferred to block 508, which reads and logs the prescribed laser parameters, e.g., acquires and stores the magnitude of the laser gas temperature at the moment the gas refill request is generated. After this operation, logic control is transferred to block 510, which determines if there are further gas fill requests to be checked; if so, logic control is returned to block 504; if not, logic control is transferred to END block 512, which terminates data acquisition procedure 500. Entire procedure 500 can be controlled automatically according to a predefined script initiated by a single keystroke.

Figure 6:
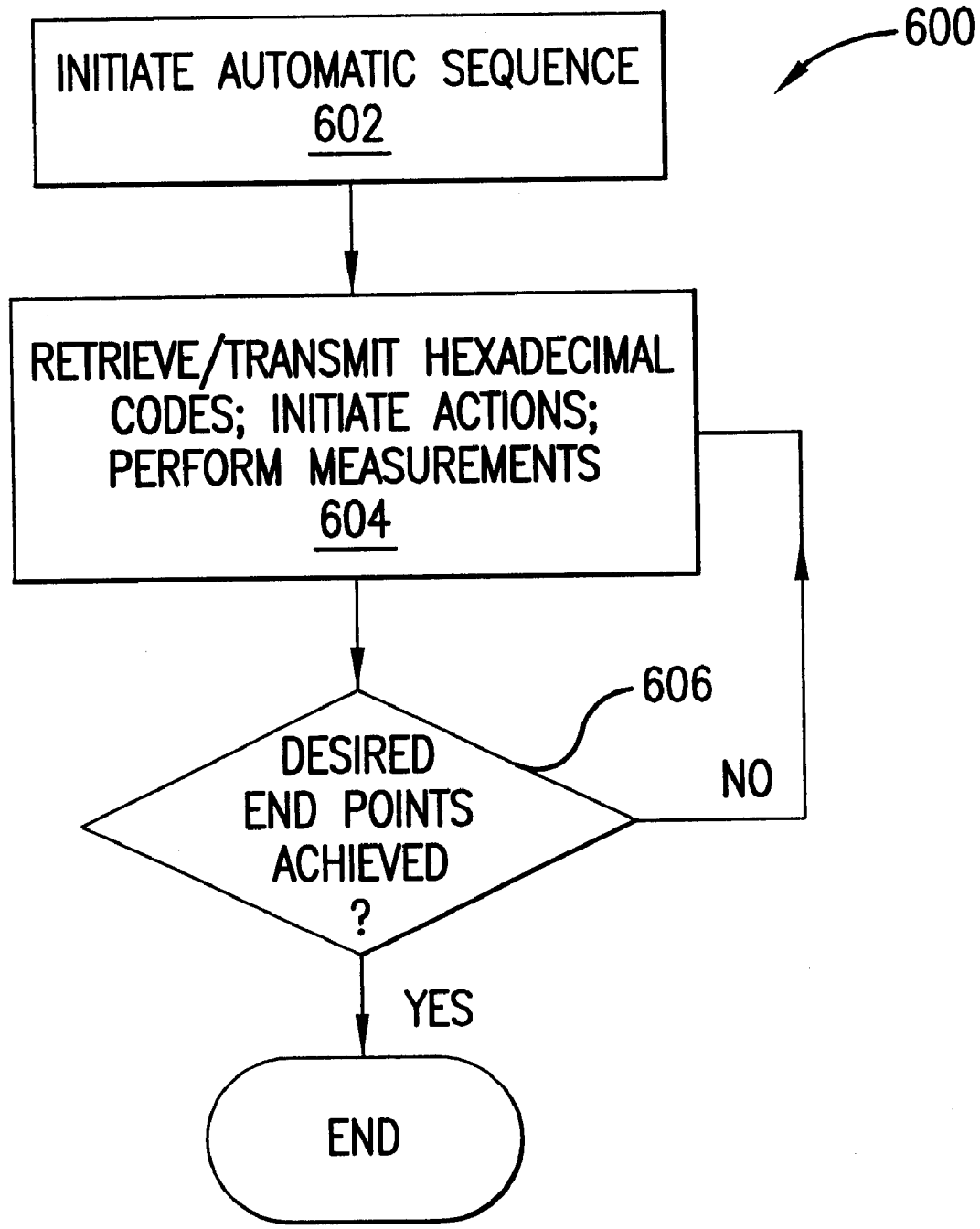
FIG. 6 is a logic flow diagram illustrating an example of automatic application of a prescribed keystroke sequence.

Similarly, upon a specified error condition, appropriate diagnostic data can be recorded, thereby facilitating trouble shooting. Optionally, a prescribed sequence of actions is initiated automatically by emulating the corresponding prescribed sequence of keystrokes. FIG. 6 is a logic flow diagram illustrating an example 600 of automatic application of a prescribed keystroke sequence. A single keystroke entered at block 602 initiates an automatic sequence of keystrokes according to a predefined script. The hexadecimal codes of these keystrokes are retrieved and transmitted to laser controller 302, actions are initiated, and measurements are made at block 604. Results are then compared with desired endpoint results at block 606. If desired endpoint results are not achieved, then logic control is returned to block 604, and the process is repeated; if desired endpoint results are detected, then logic control is transferred to END block 608, which terminates the process. Several common maintenance or trouble shooting procedures can be preprogrammed and made available to an operator, enabling multifunctional procedures such as fluorine gas optimization, weekly systems checks, data logging, etc. to be initiated "virtual hot keys" that are actuated with a single keystroke. Complex procedures requiring a multiplicity of sequential keystrokes can be automated. For example, upon a laser chamber replacement, the new chamber is filled with a fresh gas mixture and the laser operated at a prescribed repetition rate for a prescribed number of pulses. This refill procedure is repeated automatically until the laser efficiency (relative to laser operating voltage) reaches a specified value.

Conventionally, with a hand held terminal, the above steps require operator intervention and manual entry of multiple individual keystrokes. In an embodiment of the invention, multiple keystrokes and laser parameter measurements are fully automated, whereas workstation command of the laser controller remains fully functional. The time required to perform operator initiated tasks is reduced significantly, and the consistency and accuracy of data acquisition and recording are enhanced. Additionally, Virtual Laser Operator is programmable to issue a prompt on completion of an operation or subsequence of operations, for example, "TO CONTINUE, PRESS ANY KEY," allowing the operator to control continuation or termination of the task sequence, as described below in more detail.

A control bar 112 in the upper portion of display screen subsection 104 as illustrated in FIG. 1 is a main user interface, and displays the status of communications and the current operating mode of the Virtual Laser Operator program (e.g., direct Virtual Paddle control or automated control sequence in process). Control bar 112 also includes a "LASER OFF" virtual hot key 114 to stop the laser and place it in a standby state, and to interrupt all automated processes that may be running, returning control to the Virtual Paddle. Control bar 112 also includes a RESET virtual hot key 116, which stops all programs and returns control to Virtual Paddle 106. When virtual hot key 114 or 116, for example, is actuated, then a corresponding hexadecimal code is immediately generated and issued through serial communication link 300 to laser controller 302 (see FIG. 3), where it is decoded and places the laser on standby or on Virtual Paddle control. Additionally, control bar 112 includes an array of pull down menus 118 that enable an operator to change default settings, request help, change communication settings, and exit the Virtual Laser Operator program. For example, a pull down menu selection places the Virtual Paddle in a programming mode, allowing an operator or programmer to enter program instructions in a conventional programming language, i.e., C++, to create a script that links a desired sequence of measurement, data logging, and/or laser control operations to a preselected keystroke. A preselected task sequence is programmable to be executed fully automatically. Alternatively, a preselected task sequence can be broken into individual operations or subtasks, requiring a desired measurement value, and/or an operator response to a prompt, as described above, before proceeding with a subsequent operation or subtask.

Virtual Paddle 106 emulates the conventional hand held terminal keypad. Functions included in Virtual Paddle 106 are laser ON/OFF keys 120, 122 and other command keys normally actuated manually to operate the laser. Most keys are self explanatory, for example having abbreviated English language labels. Function keys F1–F8 can be user programmable in the illustrated embodiment to initiate customized keystroke sequences for data logging and other repetitive tasks, and typically are not descriptively labeled. FIGS. 7A–7G are pictorial examples of display screen segments associated with function keys F1–F8 respectively.

Figure 7A:
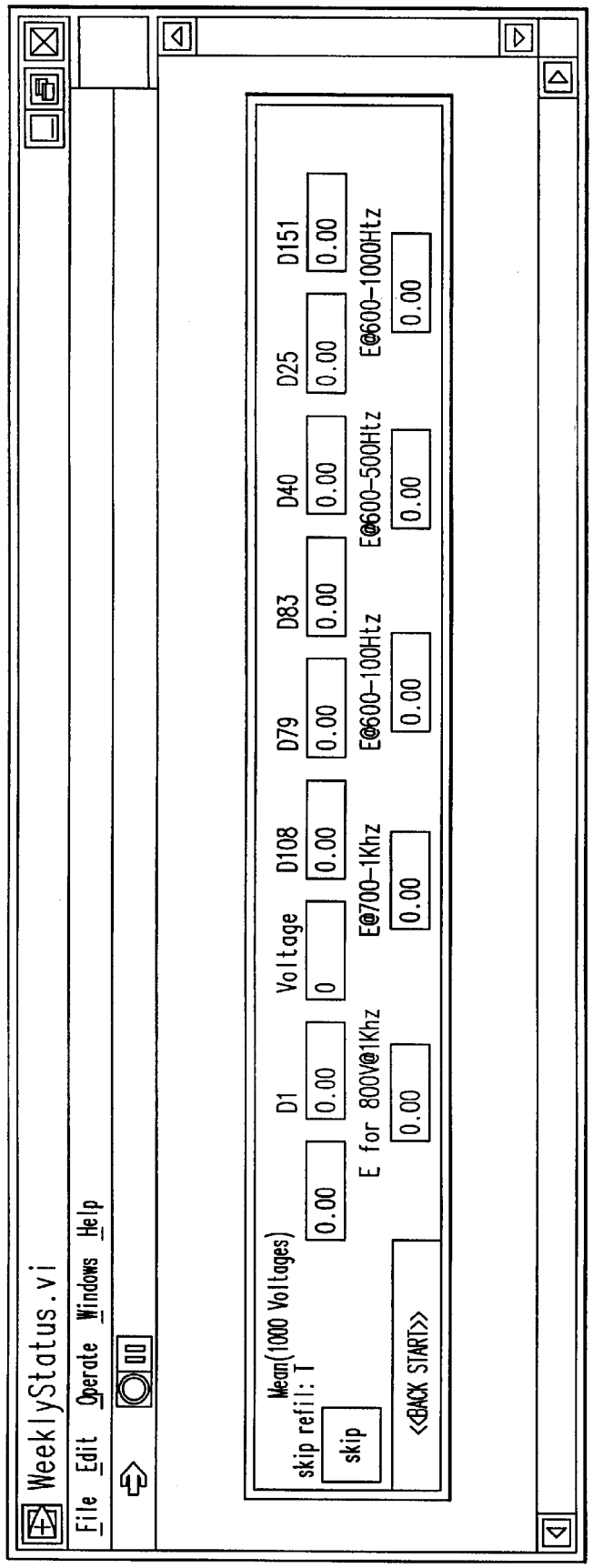
Figure 7B:
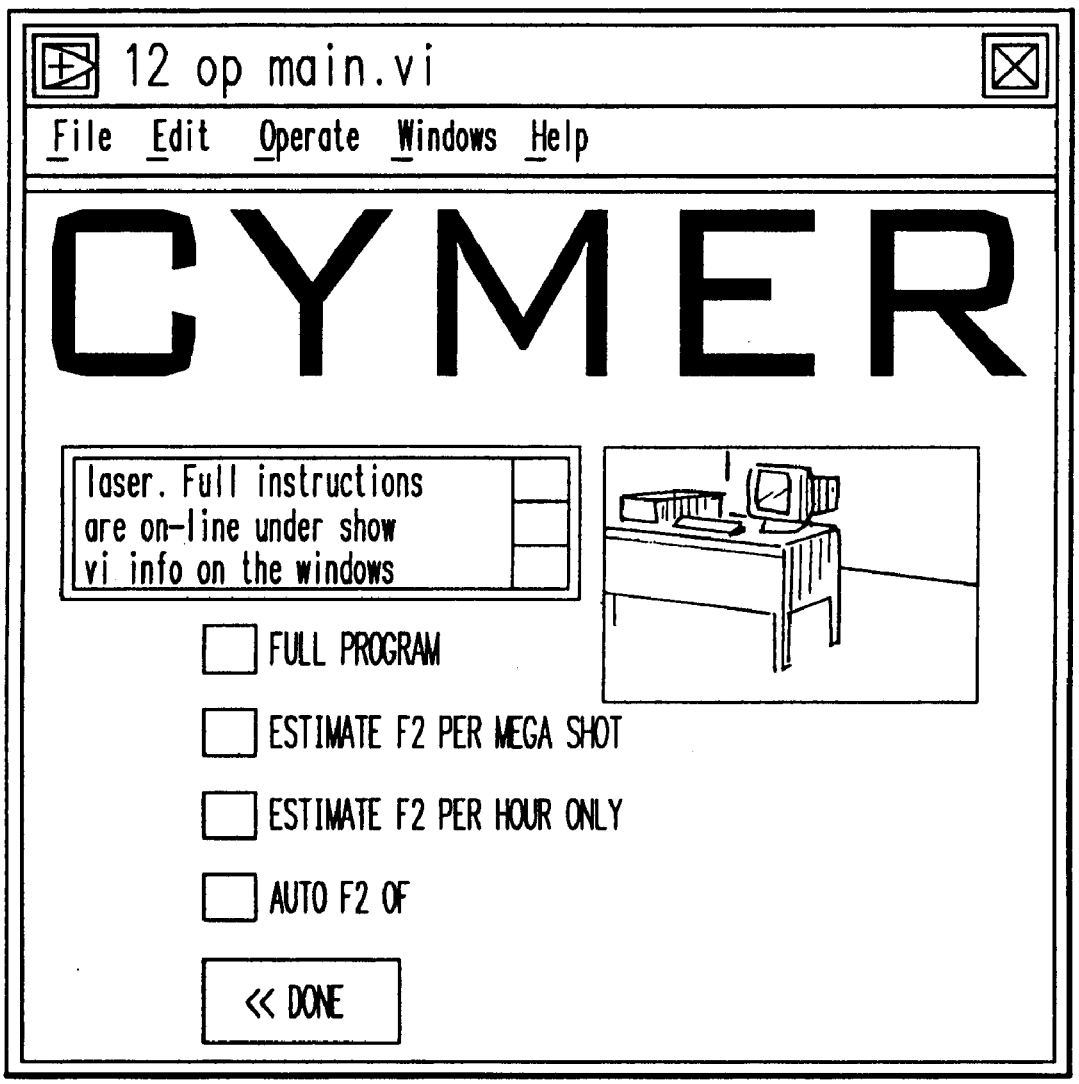
Figure 7C:
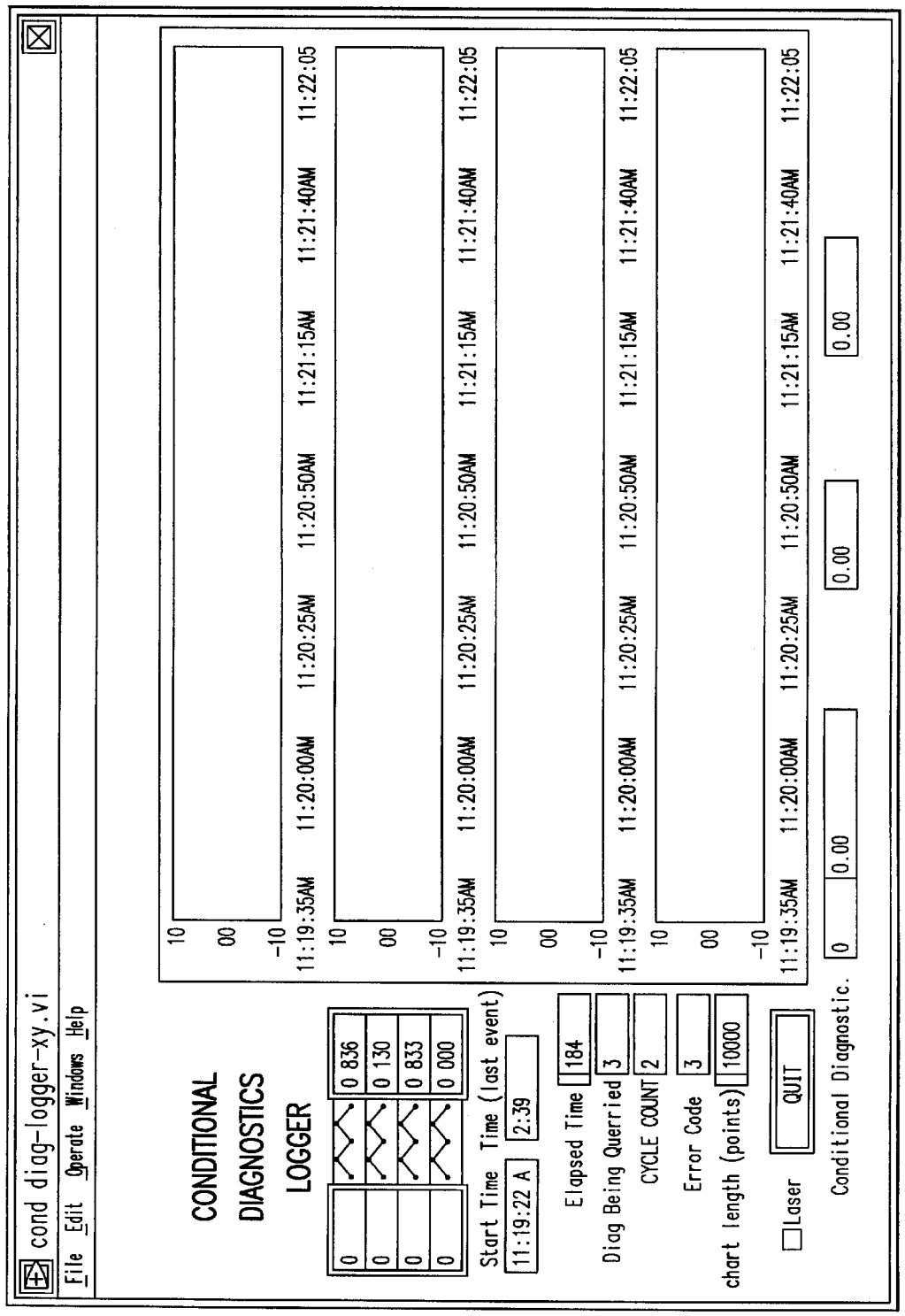
Figure 7D:
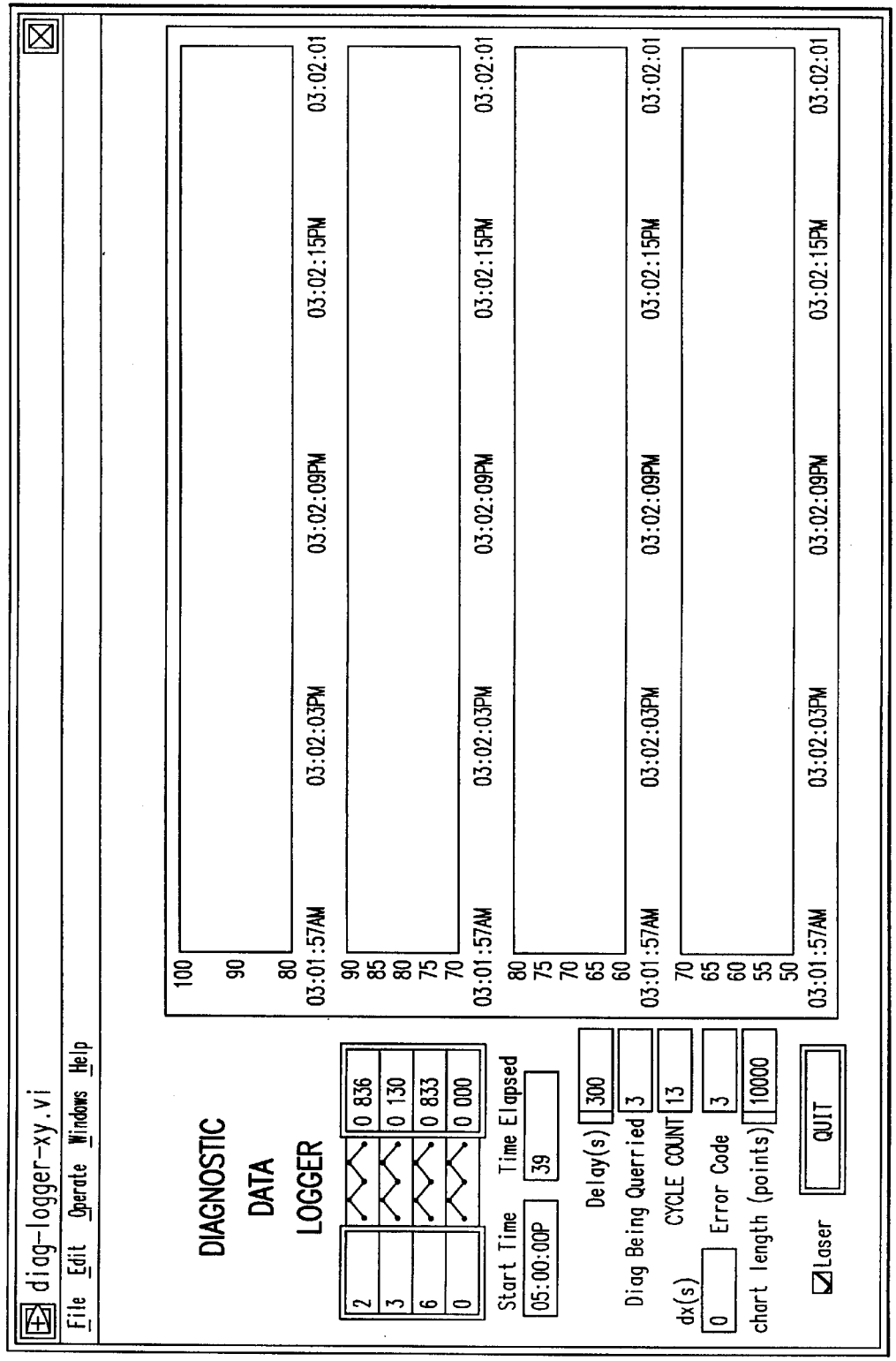
Figure 7E:
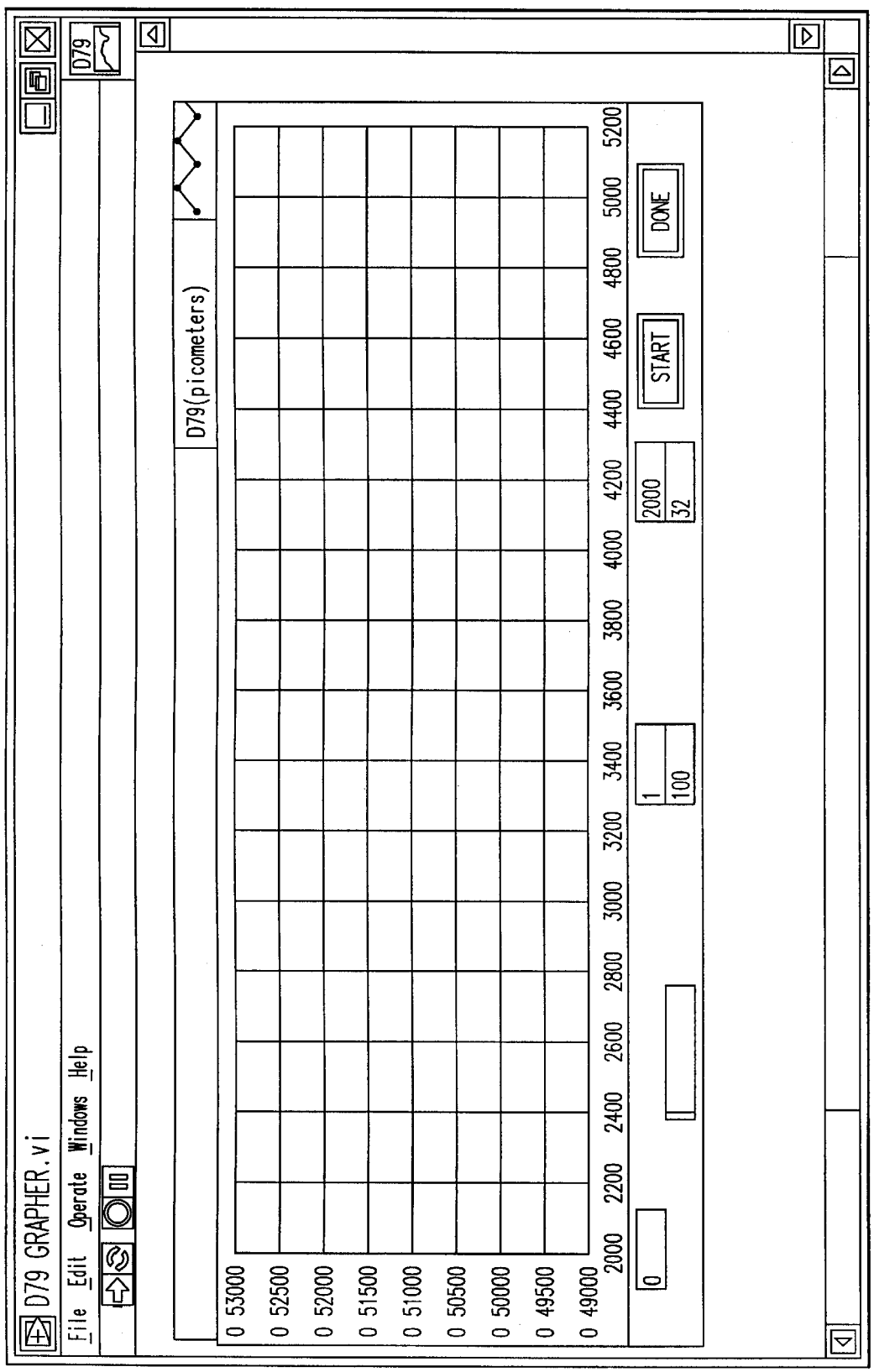
Figure 7G:
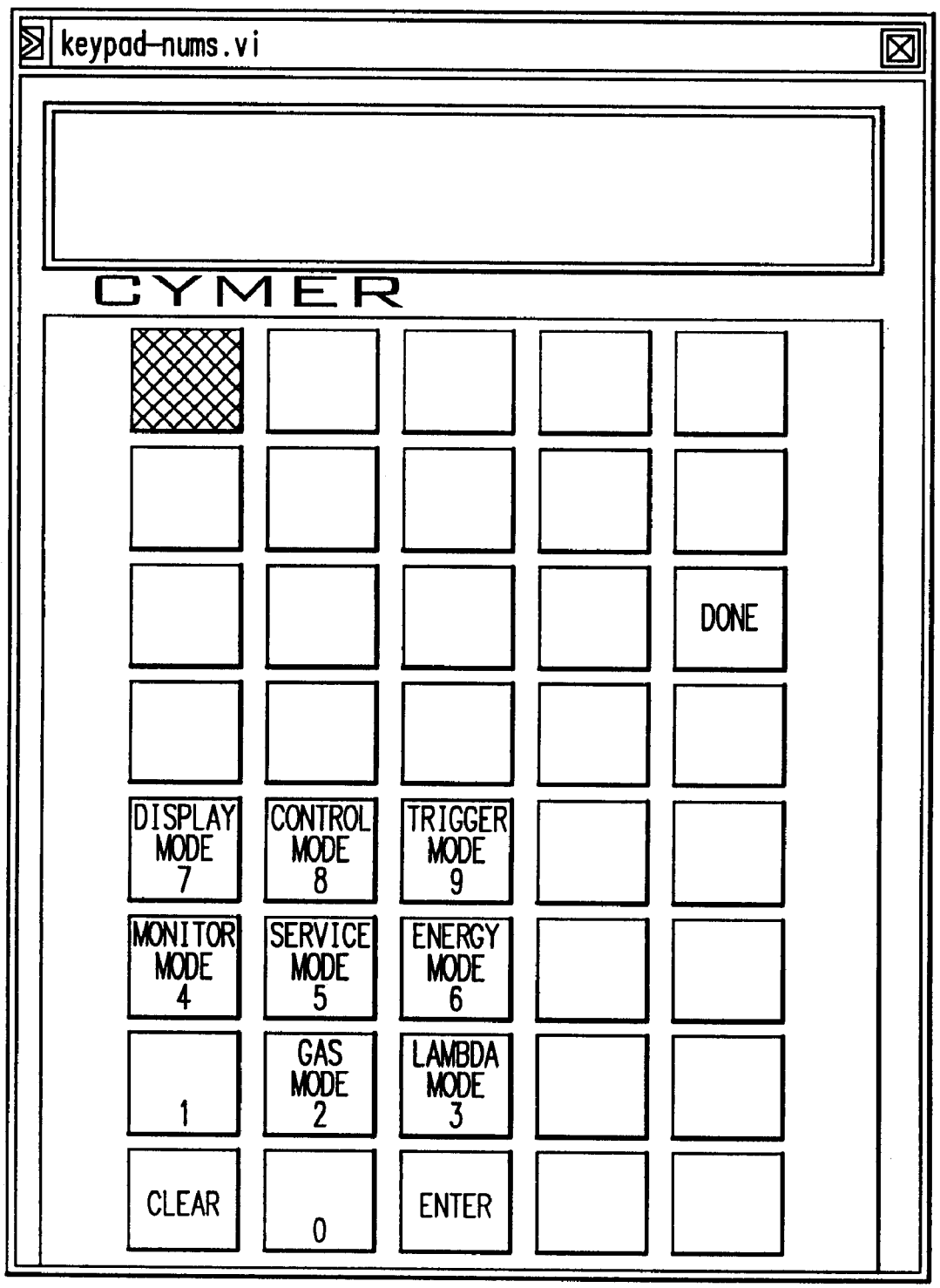

Function F1 illustratively activates a weekly status report, including monitoring certain diagnostics at different laser voltages and energies. This program automatically steps through a prescribed sequence of energy and voltage settings, while automatically recording the desired diagnostic data. FIG. 7A shows an example of a display screen segment associated with function F1. Function F2 illustratively enables field optimization of $F_2$ fluorine gas mixture and optimization of $F_2$ fluorine gas injection parameters. FIG. 7B shows an example of a display screen segment associated with function F2. Function F4 illustratively allows an operator to monitor simultaneously up to 3 parameters or diagnostics for out of range conditions, for example by displaying magnitudes graphically as a function of time on 3 color coded graphs. When any one of the 3 parameters or diagnostics goes out of an operator defined range, a list of other diagnostics/parameters is queried and logged. FIG. 7C shows an example of a display screen segment associated with function F4. Similarly, function F5 illustratively logs a list of diagnostics graphically at operator selectable time intervals. The diagnostics can be entered manually or can be read from a saved file, which can be optionally refreshed by the operator. FIG. 7D shows an example of a display screen segment associated with function F5. Function F6 illustratively allows an operator to automatically slew the laser wavelength, while monitoring a desired diagnostic. FIG. 7E shows an example of a display screen segment associated with function F6. Function F7 illustratively reads a Weekly Status Report data file into spreadsheet format, from which it can then be plotted and analyzed for trouble shooting. FIG. 7F shows an example of a display screen segment associated with function F7. Function F8 illustratively allows an operator to look up descriptions of selected diagnostics. FIG. 7G shows an example of a display screen segment associated with function F8.

While embodiments of the present invention have been shown and described, changes and modifications to these illustrative embodiments can be made without departing from the present invention in its broader aspects. Thus it should be evident that there are other embodiments of this invention which, while not expressly described above, are within the scope of the present invention. Therefore, it will be understood that the appended claims necessarily encompass all such changes and modifications as fall within the described invention's true scope; and further that this scope is not limited merely to the illustrative embodiments presented to demonstrate that scope.

What is claimed is:

1. An apparatus comprising:
   an electric discharge laser having as a normal operator input device a hand held terminal;
   a laser controller interconnected with said electric discharge laser; and
   a computer remote from and communicating with said laser controller, said computer being an upgrade for said hand held terminal, and incorporating a display screen having a plurality of imaged virtual keys, at least a portion of said virtual keys programmably emulating physical keys on said hand held terminal, at least one of said virtual keys configured to programmably emulate a prescribed sequence of keystrokes.

2. The apparatus of claim 1, wherein said display screen includes a "LASER OFF" virtual key.

3. The apparatus of claim 1, wherein said computer is interconnected to said laser controller with an electrically conductive cable.

4. The apparatus of claim 1, wherein said electric discharge laser is selected from the group consisting of KrF and ArF excimer lasers and $F_2$ molecular lasers.

5. The apparatus of claim 1, wherein said electric discharge laser provides a radiation exposure source for microlithography.

6. A method of controlling an electric discharge laser having as an input device a hand held terminal comprising the steps of:
   A) replacing a said hand held terminal with a remote computer having a display screen with virtual keys simulating keys on said hand held terminal and having at least one virtual key configured to programmably emulate a prescribed sequence of keystrokes; and
   B) applying a keystroke by actuating a virtual key on said display screen, said virtual key programmably emulating a prescribed sequence of keystrokes of said hand held terminal, thereby causing said electric discharge laser to execute a desired sequence of steps.

7. The method of claim 6, wherein said desired sequence of steps comprises measuring a value of a laser parameter.

8. The method of claim 6, wherein said desired sequence of steps comprises recording a value of a laser parameter.

9. The method of claim 6, wherein said desired sequence of steps comprises changing a value of a laser parameter.

10. The method of claim 6, wherein a portion of said prescribed sequence is automated.

11. The method of claim 6, wherein a portion of said prescribed sequence is conditioned on an action.

12. The method of claim 6, wherein said prescribed sequence is defined according to a programmably created script.

13. The method of claim 6, wherein one of said virtual keys emulates a function key.

14. The method of claim 6, wherein said applying said keystroke is performed by manually pressing the position of a corresponding virtual key on a touch sensitive screen.

15. The method of claim 6, wherein said applying said keystroke is performed by actuating a pointing device.

16. The method of claim 6, wherein signals are communicated between said computer and said laser through an electrically conductive cable.

17. The method of claim 6, wherein signals are communicated between said computer and said laser through a fiber optic cable.

18. The method of claim 6, wherein signals are communicated between said computer and said laser through a wireless communication channel.

19. The method of claim 6, wherein said electric discharge laser is selected from the group consisting of KrF and ArF excimer lasers and $F_2$ molecular lasers.

20. The method of claim 16, wherein said electric discharge laser provides a radiation exposure source for microlithography.

* * * * *